(12) United States Patent
Carroll

(10) Patent No.: US 7,627,624 B2
(45) Date of Patent: Dec. 1, 2009

(54) DIGITAL SIGNAL AVERAGING USING PARALLEL COMPUTATION STRUCTURES

(76) Inventor: Chester Carroll, 20665 Senator Claude Pepper Dr., Camp Hill, AL (US) 36850

(*) Notice: Subject to any disclaimer, the term of this patent is extended or adjusted under 35 U.S.C. 154(b) by 282 days.

(21) Appl. No.: 11/624,211

(22) Filed: Jan. 17, 2007

(65) Prior Publication Data

US 2008/0172437 A1 Jul. 17, 2008

(51) Int. Cl.
 *G06F 7/38* (2006.01)
(52) U.S. Cl. ..................................... 708/445
(58) Field of Classification Search ............... None
 See application file for complete search history.

(56) References Cited

U.S. PATENT DOCUMENTS 5,068,818 A * 11/1991 Uramoto et al. ............. 708/445
6,512,523 B1 * 1/2003 Gross ......................... 345/606
7,328,230 B2 * 2/2008 Aldrich et al. .............. 708/445
7,437,399 B2 * 10/2008 Yamashita .................. 708/445

* cited by examiner

*Primary Examiner*—David H Malzahn
(74) *Attorney, Agent, or Firm*—Thomas, Kayden, Horstemeyer & Risley

(57) ABSTRACT

Systems and methods for digital signal averaging using parallel computation structures are disclosed herein. An exemplary method includes: receiving a series of samples in the time domain, each sample containing a number of bit positions M; averaging, using coefficient polynomial arithmetic, the value in a selected one of the bit positions in each of the samples to produce an average of the bit position, wherein the selected bit position remains constant during the averaging; and repeating the averaging for another selected bit position. Another exemplary method includes: receiving a series of samples in the time domain, each sample containing the same number predefined number of bit positions M; and for each bit position, averaging, using coefficient polynomial arithmetic, the value in the corresponding bit position in each of the samples to produce a plurality of averages, each average corresponding to one of the bit positions.

13 Claims, 7 Drawing Sheets

DIGITAL SIGNAL AVERAGING USING PARALLEL COMPUTATION STRUCTURES

CROSS REFERENCE TO RELATED APPLICATIONS

Not applicable.

FIELD OF THE DISCLOSURE

The present disclosure relates to parallel computation structures, and more specifically, to apparatus and methods of digital signal averaging using parallel computation structures.

BACKGROUND

The processing of digital signals is common in many areas of electronics, including audio processing, video processing, data communication, and voice communication. In the real world, the input analog signals are subject to corruption in a variety of ways, such as noise. The conversion of analog signals to digital form includes sampling the analog signal periodically. If converted in a straightforward manner, the corrupted analog signal results in a digital samples which are themselves corrupt (i.e., not representative of the actual received analog signal at the corresponding point in time). The effect of corrupted samples can be mitigated by increasing the sampling frequency and then taking an average of the samples. For example, a system which originally sampled every 1 μs and produced a digital output every 1 μs could be improved by increasing the frequency to 125 ns (0.125 μs), taking 8 samples in the same 1 μs period, and producing, every 1 μs, an average of the 8 samples. However, conventional techniques for designing logic circuits to average digital samples are too slow for this increased sampling frequency, since these techniques rely on adder logic that propagates a carry bit from the least significant bit position to the most significant bit position. Therefore, a need exists to address these and other deficiencies.

SUMMARY

Systems and methods for digital signal averaging using parallel computation structures are disclosed herein. An exemplary method of averaging a series of digital samples includes the steps of: receiving a series of samples in the time domain, each sample containing a number of bit positions M; averaging, using coefficient polynomial arithmetic, the value in a selected one of the bit positions in each of the samples to produce an average of the bit position, wherein the selected bit position remains constant during the averaging; and repeating the averaging for another selected bit position. Another exemplary method of averaging a series of digital samples includes the steps of: receiving a series of samples in the time domain, each sample containing the same number of predefined bit positions M; and for each bit position, averaging, using coefficient polynomial arithmetic, the value in the corresponding bit position in each of the samples to produce a plurality of averages, each average corresponding to one of the bit positions.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

DETAILED DESCRIPTION

Figure 1:
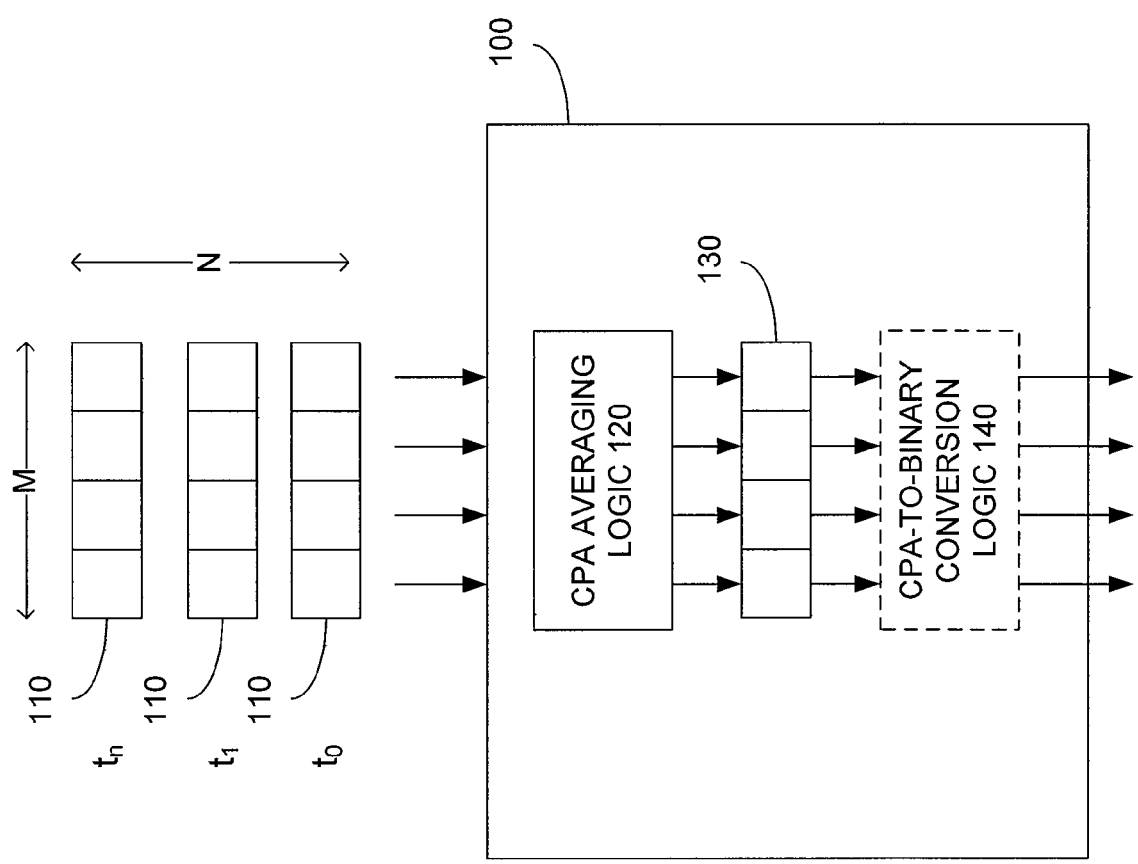
FIG. 1 is a block diagram of one embodiment of the apparatus and methods of digital signal averaging using parallel computation structures disclosed herein.

FIG. 1 is a block diagram of one variation of the apparatus and methods of digital signal averaging using parallel computation structures disclosed herein. A series of digital samples 110, in the time domain, is provided to logic for digital signal averaging using parallel computation structures 100. Samples 110, each M bits wide, are periodically provided to coefficient polynomial arithmetic (CPA) averaging logic 120. As will be described in further detail below, CPA averaging logic 120 employs an inventive technique using coefficient polynomial values rather than ordinary binary values when averaging.

After an initial latency of N samples, CPA averaging logic 120 produces as output an average of the N samples (130). One variation of CPA averaging logic 120 produces an average of those samples stored in CPA averaging logic 120 at any particular point in time. Another variation produces an average of all samples provided to CPA averaging logic 120 since a particular starting point. The averages produced by these two variations will be referred to hereinafter as "periodic" and "running" averages, respectively.

CPA averaging logic 120 continues to produce additional average outputs 130 as additional samples 110 are clocked in to CPA averaging logic 120. In some variation, an average 130 is available at the output of CPA averaging logic 120 as each new sample 110 is clocked in (after some amount of circuit delay, as should be understood by a person of ordinary skill in the art).

As can be seen in FIG. 1, CPA averaging logic 120 expands the width of average 130 to greater than the width of input sample 110. Specifically, the width of average 130 is related to the number of samples (N), which can also be viewed as the depth of CPA averaging logic 120. Coefficient polynomial addition of N single-bit values results in an output that is $L=\log_2(N)+1$ bits wide. For example, coefficient polynomial addition of 8 single-bit values results in a 4-bit output: $\log_2(8)+1=4$. Thus, the total width of average 130 is $M \times (\log_2(N)+1)$.

CPA-to-binary conversion logic 140 receives average 130, supplied by CPA averaging logic 120, and converts average 130 from CPA form to ordinary binary form. CPA-to-binary conversion logic 140 may be useful in variations in which logic 110 is used with conventional digital components which expect ordinary binary inputs. However, CPA-to-binary conversion logic 140 is optional, and may be useful in variations in which speed and/or size is important.

Figure 2:
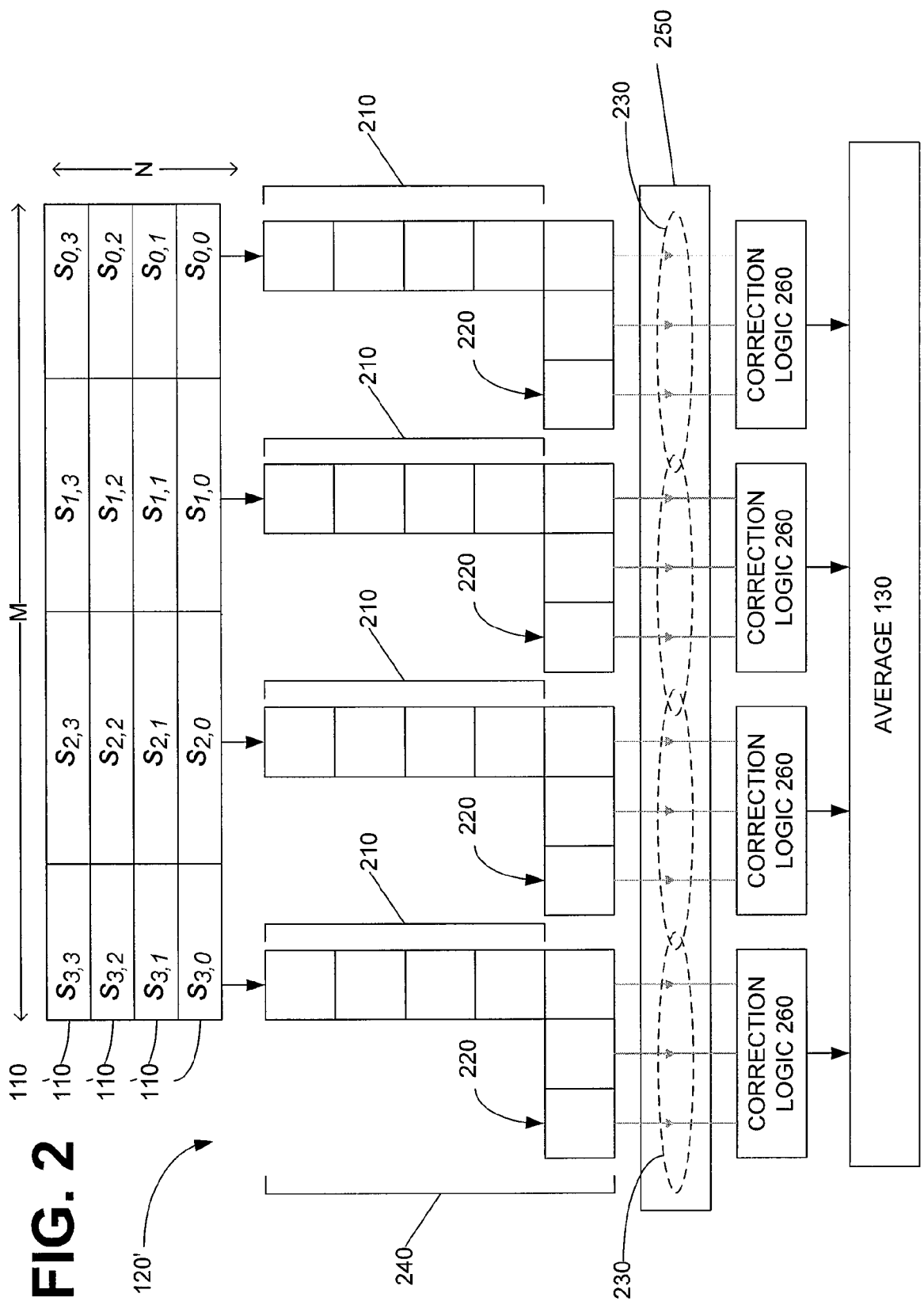
FIG. 2 is a block diagram showing one embodiment of the CPA averaging logic of FIG. 1.

FIG. 2 is a block diagram showing one variation of the CPA averaging logic of FIG. 1 in more detail. In this embodiment (CPA averaging logic 120'), 4 samples 110 are collected. Each of the samples 110 are 4 bits wide. That is, using the terminology of FIG. 1, M=4 and N=4. However, a person of ordinary skill in the art should appreciate that CPA averaging logic 120' can be scaled to larger values of M and N without significant loss of speed, for reasons that will be explained below.

Each bit of sample 110 is provided as input to a bit-wide shift register 210. Since there are M bits in sample 110, CPA averaging logic 120' includes M shift registers 210. Although shift registers are typically depicted with a horizontal orientation, the bits in each shift register 210 are logically arranged in a column (i.e., vertically oriented), as can be seen in FIG. 2. Each shift register 210 has depth N, the number of samples 110 stored in CPA averaging logic 120' at any point in time. In other words, each shift register 210 forms a column of bits, and with each new sample 110 the bits in each shift registers 210 shift from top to bottom.

A counter register 220 is located (logically) at the bottom of each column. As a new bit enters a shift register 210, the oldest bit is shifted out into the corresponding counter register 220. Counter register 220 counts the number of bits having value 1 and produces this count as output 230. Thus, once N samples 110 have been input to CPA averaging logic 120', each counter output 230 represents the number of 1's in the corresponding column's sample 110. A person of ordinary skill in the art should understand that the width of each counter register 220 is at least $L=\log_2(N)+1$, which is large enough to hold the largest possible count of 1's in N samples.

The function performed by this arrangement of a columnar shift register 210, of depth N, feeding a counter register 220 can also be viewed as adding a series of N bits. That is, each combination of shift register 210 and counter register 220 acts as a CPA adder 240 of N single-bit inputs.

Since each CPA adder 240 (combination of shift register 210/counter register 220) adds the values in one particular bit position of shift register 210, CPA averaging logic 120' as a whole can be viewed as adding N M-bit samples 110. However, unlike conventional multi-bit-wide adders, CPA averaging logic 120' does not propagate the carry bit between bit positions. In CPA averaging logic 120', each bit position in sample 110—each column—is independent of all the other bit positions.

CPA averaging logic 120' maintains accuracy without propagating of a carry bit because each counter output 230 is $\log_2(N)+1$ bits wide. This addition technique is known as coefficient polynomial arithmetic (CPA), so named because each bit in the output represents the coefficient of a power of 2: 110 represents $1\times2^2+1\times2^1\times0\times2^0$. The entire sum of N M-bit samples 110 is contained, in CPA form, in the concatenation of the M counter registers 220, which can be viewed as a single $(M\times\log_2(N)+1)$-bit macro register 250. The contents of macro register 250, in CPA form, accurately represent the current sum of the previous N samples 110 at any point in time.

CPA averaging logic 120' further processes the contents of counter registers 220—the sum of the previous N samples 110—to produce the output average 130. As stated earlier, a counter register 220 represents the number of 1's in the corresponding column's sample 110. When the time between samples 110 is small enough, variation in the value of a particular bit position is likely to be caused by random noise or corruption of the input signal. That is, when N samples 110 are closely spaced, the uncorrupted input signal is likely to be either all 0s or all 1s, which produces a count of either 0 or $\log_2(N)+1$. For example, 4 consecutive single-bit samples 110 are most likely to add up to either 4, which is expressed in CPA form, using 3-bits, as 100, or to add up to 0, which is expressed in CPA form, using 3 bits, as 000.

Correction logic 260 uses this principle to determine the most likely sum of an uncorrupted bit position in sample 110, and produces a corrected single bit output 270 from the N-bit input 230 provided by counter register 220. In some variations, correction logic 260 produces an output of 0 if input 230 is less than N/2, and produces an output of $\log_2(N)+1$ if input 230 is more than N/2. Viewed another way, correction logic 260 outputs $\log_2(N)+1$ if the majority of samples 110, represented by the contents of counter register 220, are 1s and outputs zero if the majority of samples 110 are not 1s. This variation of correction logic 260 requires a majority of 1s in a presumably corrupted sample 110 to recognize an uncorrupted value of "all 1s". Correction logic 260 may be implemented as two level logic based on a truth table, as should be understood by a person of ordinary skill in the art. That is, for a given input, correction logic 260 produces a particular output.

Other variations of correction logic 260 are also possible, which require a different number of 1s to recognize the uncorrupted value of "all 1s". As should be recognized by a person of ordinary skill in the art, correction logic 260 can therefore be tuned to the expected probability of noise or corruption: if samples are expected to be corrupted often, then fewer 1s are required to recognize the series of samples as an uncorrupted series of all 1s.

One instance of correction logic 260 is used for each counter register 220, so that M-bit average 130—the output of the CPA averaging logic 120' from FIG. 2—is the combination of the M single bit outputs 270. average 130 is produced without division, shifting right, or discarding rightmost bits. A person of ordinary skill in the art should recognize that such an average without division is possible because of the inherent properties of binary arithmetic.

The use of CPA addition by logic 120' to produce average 130 allows relatively fast computation time as compared to conventional addition techniques, which must wait on the carry to propagate (ripple) from one bit position (column) to another. Since bit paths through CPA averaging logic 120' are independent, this parallel architecture scales much better than traditional techniques for averaging, which are typically too slow for use for high frequency samples.

Figure 3:
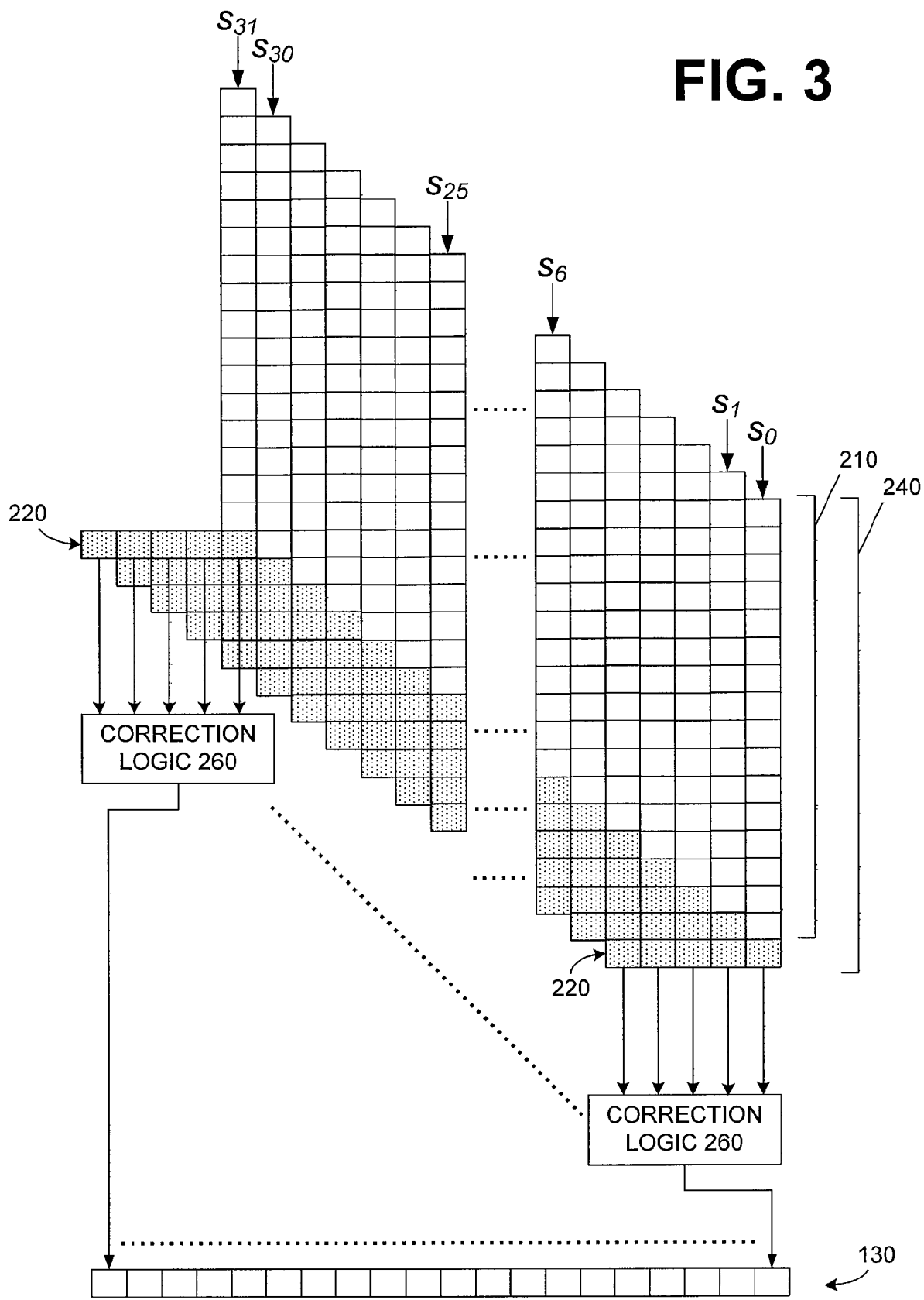
FIG. 3 is a block diagram of another embodiment of the CPA averaging logic from FIG. 1.

FIG. 3 is a block diagram of another variation of the CPA averaging logic from FIG. 2, but with a larger scale: a depth of 16 samples 110, each 32 bits wide (e.g., M=32 and N=16). A person of ordinary skill in the art should recognize that not all bit positions are illustrated in FIG. 3: in order to fit the entire circuit on the page, only the most significant ($S_{32}\ldots S_{25}$) and least significant ($S_6\ldots S_0$) bit positions are shown. However, a person of ordinary skill in the art should be able to understand the entire (32-bit wide×16-bit) deep arrangement from the information given.

Many features in FIG. 3 are the same as in FIG. 2. CPA averaging logic 120' does not propagate the carry bit between bit positions, and each bit position in sample 110 (each column) is independent of all the other bit positions. Each shift register 210 is vertically oriented, with each columnar shift register 210 providing input to a corresponding counter register 220. However, counter registers 220 in FIG. 3 are 5 bits wide, the number needed to count the maximum value of 1s (16) counted by a shift register 210 with depth 16. As with FIG. 2, the output of each counter register 220 feeds into instances of correction logic 260. As described above, correction logic 260 outputs either a 0 or a 1, based whether a majority of inputs has value 1. Average 130 is composed of the individual outputs of correction logic 260.

A person of ordinary skill in the art should recognize that although the columnar shift registers 210 are shown as overlapping in this diagram, the bit paths through CPA averaging logic are nonetheless independent. Thus, each instance of counter register 220 receives input from, and thus counts, only bits from its corresponding shift register 210, that is, the column shown directly above the counter register 220. In this example, a counter register 220 does not provide input to the counter register 220 located (logically) below it. This independence of bit paths allows CPA averaging logic 120' to scale to M=32 and N=16, as shown here, and to even larger sizes, since more significant bit positions do not wait on computations performed on less significant bit positions. Although the independence of the bit paths is more apparent FIG. 2, the columns are shown as overlapping in FIG. 3 in order to minimize the space needed to show the entire 32×16 arrangement. Nonetheless, the logical relationship between columnar shift registers 210, counter registers 220, correction logic 260 and average 130 is the same in both figures, with the sizes being different. A person of ordinary skill in the art should also understand that although only two instances of correction logic 260 are shown—one for the least significant bit of input sample 110 and the other for the most significant bit of input sample 110—the actual implementation includes 32 instances of correction logic 260, one for each column.

Figure 4:
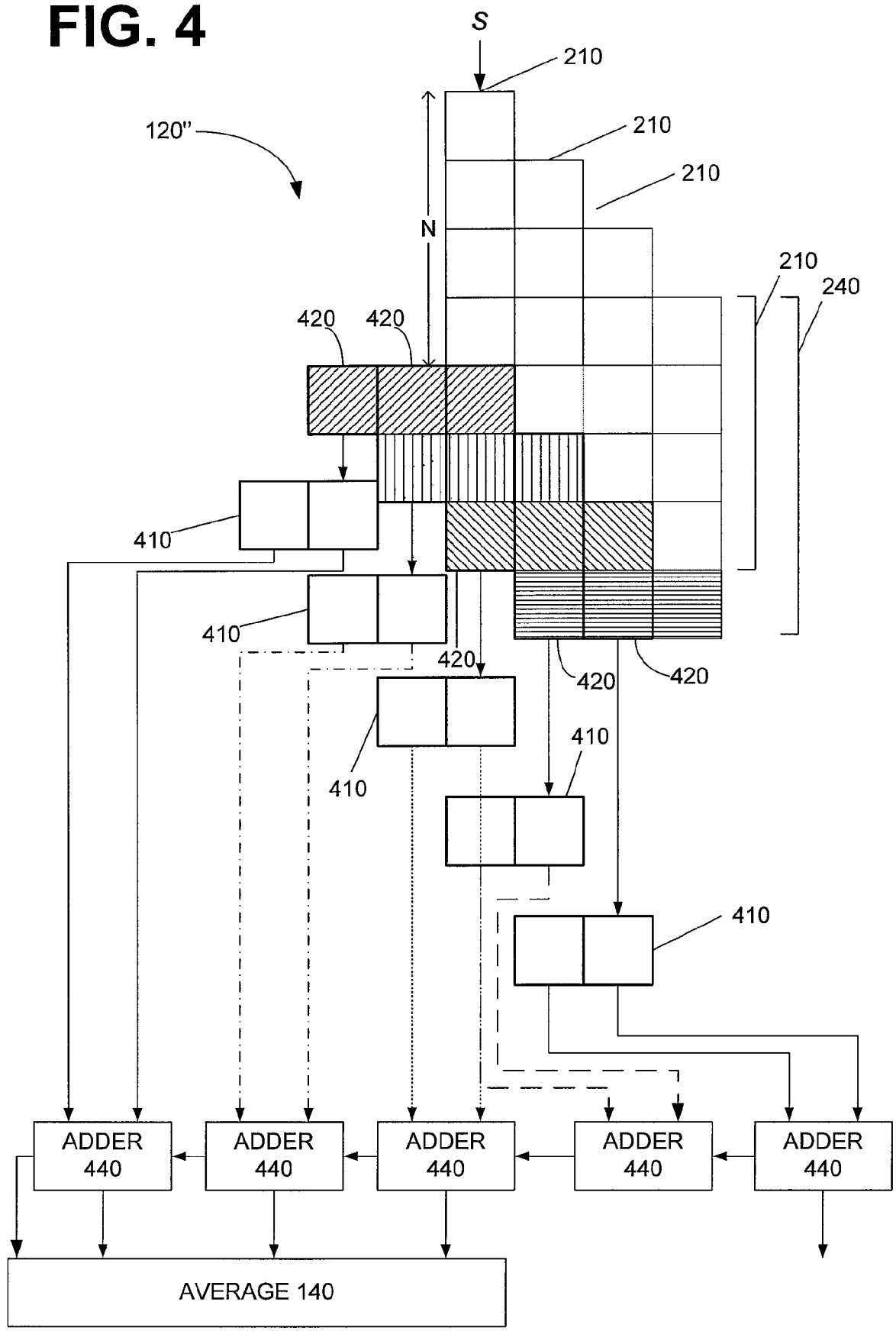
FIG. 4 is a block diagram of another variation of the CPA averaging logic from FIG. 1.

FIG. 4 is a block diagram of another variation of the CPA averaging logic from FIG. 1, which also handles 4 samples 110 that are each 4 bits wide (i.e., M=4 and N=4. CPA averaging logic 120" includes instances of CPA adders 240 (pairs of columnar shift registers 210 and counter registers 220). As with the embodiments of FIGS. 2 and 3, CPA averaging logic 120" does not propagate the carry bit between bit positions, and each bit position in sample 110 (each column) is independent of all the other bit positions.

However, in FIG. 2 the outputs 230 of counter registers 220 also remain independent of each other, and are not combined by correction logic 260 in producing output average 130. In contrast, in FIG. 4, the outputs of different counter registers 220 are combined, as described below, in producing average 130.

As can be seen in FIG. 4, counter registers 220 are "stacked" vertically so that some bits of counter registers 220 overlap to feed into an additional instance of a counter register 410 (not present in FIG. 2). This stack counter register 410 counts the number of 1s in the corresponding stack 420. The output 430 of each stack counter register 410 is fed into a corresponding full adder 440, where full adders 440 are chained together by carry propagation, as should be understood by a person of ordinary skill in the art.

Since the combined output of full adders 440 is wider than the M-bit input to CPA averaging logic 120" (sample 110), the rightmost or least significant bits are discarded to produce M-bit output average 130. In this example, the combined output of full adders 440 is 6 bits wide, and the input sample 110 is 4 bits wide (i.e., N=4), so the number of discarded bits is 2. As should be appreciated by a person of ordinary skill in the art, discarding these 2 least significant bits is equivalent to shifting right by 2, which is also equivalent to dividing by N=4, the depth of columnar shift registers 210. Such a person should also appreciate that this arrangement of CPA averaging logic 120"—summing of samples 110 by CPA adders 240 then division by shifting right—is equivalent to taking an arithmetic average of samples 110. Thus, the effect of CPA averaging logic 120" is to take the arithmetic average of samples 110.

The counter registers 220 are arranged so there is one bit of overlap between each. Therefore, as should be recognized by a person of ordinary skill in the art, the height of counter register stacks 420 is dependent on the width of sample 110 and the width of counter registers 220, which is turn is dependent on the depth of shift registers 210. In the particular example of FIG. 4, the height of each stack 420 varies from 1 to 3 bits. Therefore, each stack counter output 430 is 2 bits wide (to handle adding up to 3 bits) and can thus be provided as input to a corresponding full adder 440. A person of ordinary skill in the art should understand that in implementations where the stack counter output 430 is wider than the 2 bits that can be added by a full adder 440, additional levels of stack counter registers 410 can be provided and combined to produce 2-bit inputs to full adder 440.

Figure 5:
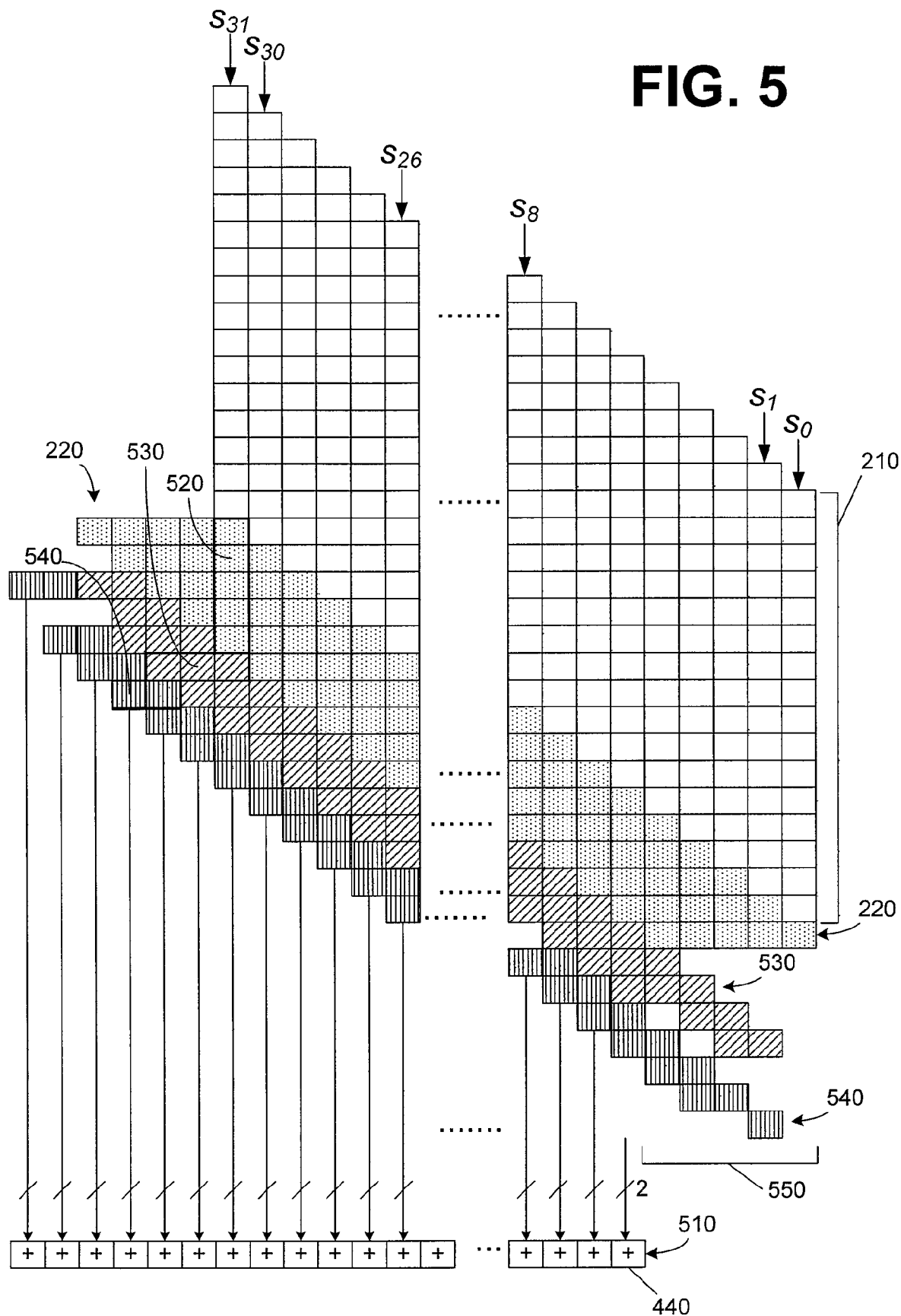
FIG. 5 is a block diagram of another variation of the CPA averaging logic from FIG. 1.

FIG. 5 is a block diagram of another variation of the CPA averaging logic from FIG. 4, but with a larger scale: a depth of 16 samples 110, each 32 bits wide (e.g., M=32 and N=16). A person of ordinary skill in the art should recognize that not all bit positions are illustrated in FIG. 5: in order to fit the entire circuit on the page, only the most significant ($s_{32} \ldots s_{26}$) and least significant ($s_8 \ldots s_0$) bit positions are shown. However, a person of ordinary skill in the art should be able to understand the entire (32-bit wide×16-bit) deep arrangement from the information given.

Many features in FIG. 5 are the same as in FIG. 4: As with the embodiments of FIGS. 2-4, CPA averaging logic 120" does not propagate the carry bit between bit positions, and each bit position in sample 110 (each column) is independent of all the other bit positions. Shift register 210 are vertically oriented, with each columnar shift register 210 providing input to a corresponding counter register 220. The M-bit output average 130 is produced by a chain (510) of full adders 440, each receiving a 2-bit input from a counter register.

As can be seen in the drawing, the embodiment of FIG. 4 uses only a single level of stack counter registers 410, where the embodiment of FIG. 5 uses an additional (second) level of stack counter registers. A person of ordinary skill in the art should appreciate that the number of levels of stack counter registers is determined as follows. Full adders 440 receive 2 bits of input, and therefore are fed by a 2-bit counter register. In FIG. 4, the tallest stack of overlapping counter registers 220 in FIG. 4 is 2 bits high, and can thus be counted by a 2-bit wide stack counter register 410. This single level of stack counter register 410 can therefore be placed between counter registers 220 (which count 1s in shift registers 210) and full adders 440. However, in FIG. 5 the tallest stack (520) of overlapping counter registers 220 is 5 bits high, and are therefore counted by a 3-bit wide first-level stack counter register 530. The vertically aligned bits from adjacent first level stack counter registers 530 are then counted by a second level stack counter register 540. Since the tallest stack of overlapping first level stack counter registers 530 in this example is 3 bits high, the second level stack counter registers 540 are 2 bits wide to accommodate the maximum number of 1s (3) in a 3-bit first-level stack counter register 530. Second level stack counter registers 540, being 2 bits wide, are then fed into full adders 440, which take 2 bits of input.

To reiterate, each parallel bit path in FIG. 5 uses the same hardware architecture shown in FIG. 4, including a CPA adder 240 for each bit position. The columnar shift registers are summed and the corresponding bit-sum is accumulated in the counter register for each column register, which can be viewed as a first phase of computation. In a second phase, overlapping 5-bit counter registers (counter registers 520) perform parallel merging, with the stack of counter registers 520 varying in height from 1 bit to 5 bits. A third phase of computation is performed by a stack of first level counter registers 530 (each counter register 530 up to 3 bits wide) that form stacks up to 3 bits high. The last phase is formed by a second level of 2-bit counter registers 540, whose values are used as the inputs to a full binary adder 510. To produce a 32-bit average 130, the 5 least significant bits (550) produced by the various levels of counter registers are ignored or discarded. Thus, it is unnecessary to include the hardware for the final processing (e.g., counting/summing) of these 5 bits, since these bits would be shifted out of the registers. A person of ordinary skill in the art should appreciate that even though this computation is described as occurring in "phases", each bit path is nonetheless independent of all others. This independence allows CPA averaging logic 120" to scale to M=32 and N=16, as shown here, and to even larger sizes, since more significant bit positions do not wait on computations performed on less significant bit positions Several variations on CPA averaging logic 120 were described above: CPA averaging logic 120' in FIGS. 2 and 3 produce a statistical average and CPA averaging logic 120" in FIGS. 4 and 5 produce an arithmetic average. The average produced by CPA averaging logic 120, such as the embodiments shown in FIGS. 2-5, can be either a periodic average of the collection of samples 110 that is present in shift registers 210 at any particular time, or a running average of all samples 110 passing through shift registers 210 since a particular starting time. Whether CPA averaging logic 120 produces a period or a running average depends on how input samples 110 are clocked in to, and average 130 is clocked out of, CPA averaging logic 120. In the periodic average variation, one average 130 is clocked out for every N samples of input. In the running average variation, an average 130 is clocked out with every sample. Thus, a single structure supports both periodic and running averages, with differences in clocking as just described.

Figure 6:
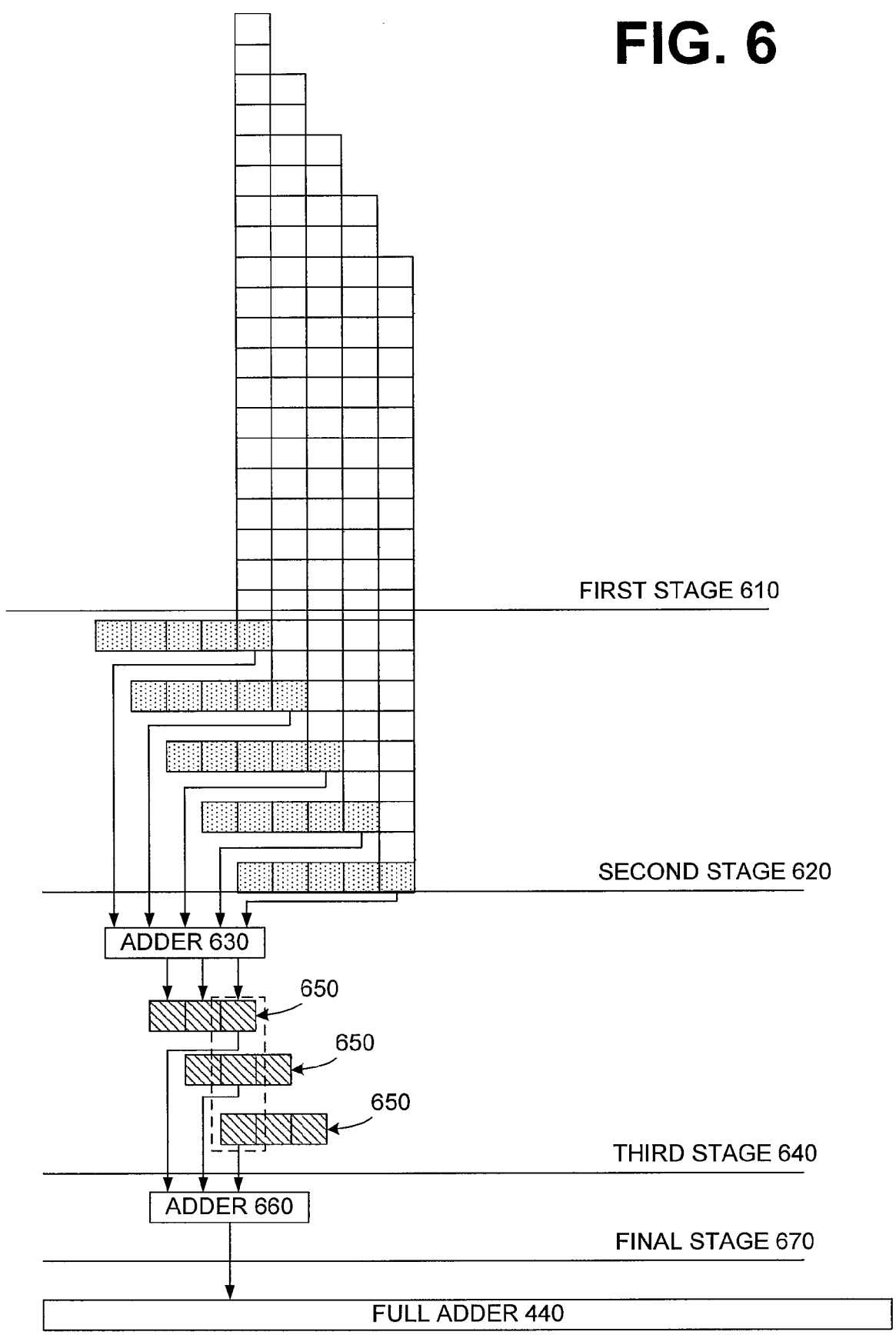
FIG. 6 is another embodiment of the CPA averaging logic from FIG. 2 which uses logic adders and registers instead of stack counter registers.

FIG. 6 is another embodiment of CPA averaging logic 120 which uses logic adders and registers in place of the stack counter registers shown in FIG. 5. Like the CPA averaging logic of FIG. 5, the embodiment in FIG. 6 performs arithmetic summation and averaging by counting the is in columns (first stage 610), and placing the binary sums in respective counter registers (second stage 620). Like the CPA averaging logic of FIG. 5, the embodiment in FIG. 6 uses a parallel full binary adder 440 to perform the final count, producing average 130. However, in the embodiment in FIG. 6, the second stage 620 output is fed to binary adders rather than stack counter registers. The logic adders 630 of the third stage (640) have 5 input bits that are summed by adder 630 into a 3 bit register 650. These three outputs form the inputs to a 3-input logic adder 660 of the final stage (670), producing the two binary bits for full binary adder 440. Full binary adder 440 consists of an ordinary, two-input, binary adder that produces the final average 130 in binary form.

Figure 7:
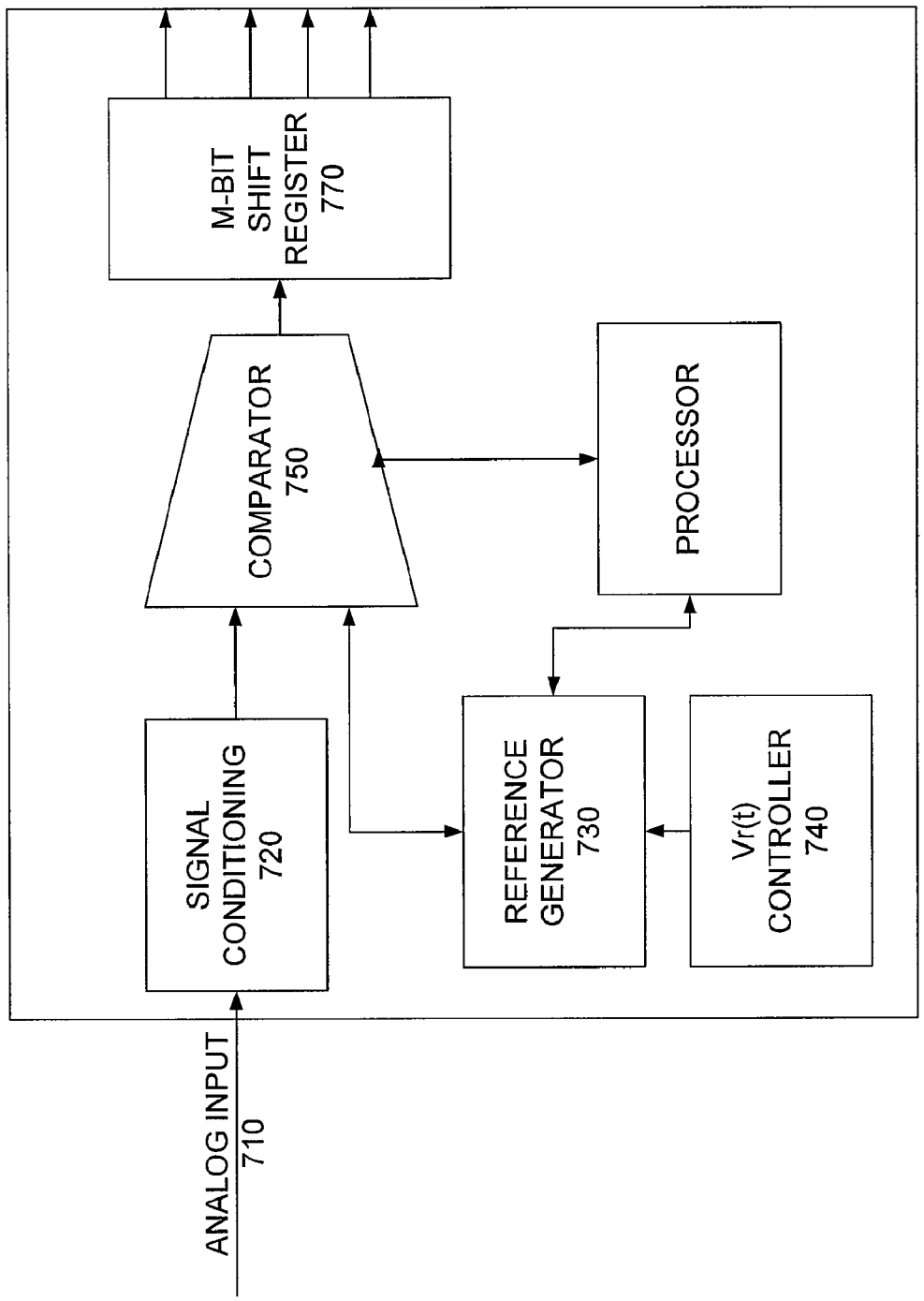
FIG. 7 is a block diagram of an exemplary system analog-to-digital converter (ADC) which includes a variation of the apparatus and methods of digital signal averaging using parallel computation structures as disclosed herein.

FIG. 7 is a block diagram of an exemplary system analog-to-digital converter (ADC) 700 which includes a variation of the apparatus and methods of digital signal averaging using parallel computation structures as disclosed herein. A sensor (not shown) provides analog input signal 710 to signal conditioning component 720. Signal conditioner 720 performs amplification, filtering, converting, and/or normalizing as appropriate so that analog signal 710 can be optimally converted to a discrete series of digital samples. A reference generator 730 produces a reference signal Vr(t) based on a control signal provided by Vr(t) controller 740. The conditioned analog signal Va(t) is provided to comparator 750, which compares inputs Va(t) and reference Vr(t) and produces an output 760 indicating whether the two inputs are equal, within the resolution of comparator 750. The binary comparator output 760 is provided to shift register 770. This input to shift register 770 is clocked by a control signal generated by microcontroller 780, which is in turn based on reference signal Vr(t) produced by reference generator 730. When the next value is shifted in, shift register 770 outputs the old value, in binary form, to logic for digital signal averaging using parallel computation structures 100. As discussed above, logic 110 uses averaging and coefficient polynomial arithmetic on the digital input provided by shift register 770 to provide a faster and more accurate digital output 790, which is the final output of ADC 700.

Any process descriptions or blocks in flowcharts should be understood as representing modules, segments, or portions of code which include one or more executable instructions for implementing specific logical functions or steps in the process. As would be understood by those of ordinary skill in the art of the software development, alternate implementations are also included within the scope of the disclosure. In these alternate implementations, functions may be executed out of order from that shown or discussed, including substantially concurrently or in reverse order, depending on the functionality involved.

The systems and methods disclosed herein can be embodied in any computer-readable medium for use by or in connection with an instruction execution system, apparatus, or device. Such instruction execution systems include any computer-based system, processor-containing system, or other system that can fetch and execute the instructions from the instruction execution system. In the context of this disclosure, a "computer-readable medium" can be any means that can contain, store, communicate, propagate, or transport the program for use by, or in connection with, the instruction execution system. The computer readable medium can be, for example but not limited to, a system or propagation medium that is based on electronic, magnetic, optical, electromagnetic, infrared, or semiconductor technology.

Specific examples of a computer-readable medium using electronic technology would include (but are not limited to) the following: an electrical connection (electronic) having one or more wires; a random access memory (RAM); a read-only memory (ROM); an erasable programmable read-only memory (EPROM or Flash memory). A specific example using magnetic technology includes (but is not limited to) a portable computer diskette. Specific examples using optical technology include (but are not limited to) an optical fiber and a portable compact disk read-only memory (CD-ROM).

The foregoing description has been presented for purposes of illustration and description. It is not intended to be exhaustive or to limit the disclosure to the precise forms disclosed. Obvious modifications or variations are possible in light of the above teachings. The implementations discussed, however, were chosen and described to illustrate the principles of the disclosure and its practical application to thereby enable a person of ordinary skill in the art to utilize the disclosure in various implementations and with various modifications as are suited to the particular use contemplated. All such modifications and variation are within the scope of the disclosure as determined by the appended claims when interpreted in accordance with the breadth to which they are fairly and legally entitled.

What I claim is:

1. A method executed by a digital signal processing circuit of averaging a series of digital samples using parallel computation circuit structures, comprising:
   receiving in the digital signal processing circuit a series of samples in the time domain, each sample containing a number of bit positions M;
   averaging, using a circuit configured to employ coefficient polynomial arithmetic, the value in a selected one of n signal sample positions using all the samples for the signal processing position to produce an average signal value of the sample position, wherein the selected sample position remains constant during the averaging;
   repeating the averaging for another selected sample position.

2. The method of claim 1, wherein the averaging of bit positions occurs in parallel and independent of other bit positions.

3. The method of claim 1, wherein the average is expressed in coefficient polynomial arithmetic form, and further comprising:
   converting the average to binary form.

4. The method of claim 1, wherein the averaging further comprises:
   counting, across the series of samples, the number of occurrences of the value 1 in the selected bit position; and
   determining the average value of the selected bit position based on the count.

5. The method of claim 4, further comprising:
   determining the average value of the selected bit position to be 1 if the count is greater than half of the number of digital samples.

6. The method of claim 1, further comprising:
   transmitting an average to a receiver.

7. The method of claim 1, wherein the method is performed synchronously.

8. The method of claim 1, wherein the method is performed asynchronously.

9. The method of claim 1, wherein the signal processing circuit is embodied in embedded circuitry as a part of a hardware processor.

10. A method executed by a digital signal processing circuit of averaging a series of digital samples using parallel computation circuit structures, comprising:
    receiving in the digital signal processing circuit a series of samples in the time domain, each sample containing the same number of predefined bit positions M;
    for each sample signal position, averaging, using a circuit configured to employ coefficient polynomial arithmetic, the sample values in the corresponding sample signal position in each of the samples to produce a plurality of averages, each average corresponding to one of the sample signal positions.

11. The method of claim 10, wherein each of the plurality of averages is expressed in coefficient polynomial arithmetic form.

12. The method of claim 10, wherein each of the plurality of averages is expressed in coefficient polynomial arithmetic form, and further comprising:
    converting each of the plurality of averages to binary form.

13. The method of claim 10, further comprising:
    transmitting an average to a receiver.

* * * * *